(12) United States Patent
Huang

(10) Patent No.: US 6,656,772 B2
(45) Date of Patent: Dec. 2, 2003

(54) METHOD FOR BONDING INNER LEADS TO BOND PADS WITHOUT BUMPS AND STRUCTURES FORMED

(75) Inventor: Yuan-Chang Huang, Shinjuang (TW)

(73) Assignee: Industrial Technology Research Institute, Hsin Chu (TW)

(*) Notice: Subject to any disclaimer, the term of this patent is extended or adjusted under 35 U.S.C. 154(b) by 8 days.

(21) Appl. No.: 09/991,723

(22) Filed: Nov. 23, 2001

(65) Prior Publication Data
US 2003/0098513 A1 May 29, 2003

(51) Int. Cl.[7] ............................................... H01L 21/00
(52) U.S. Cl. ....................................................... 438/123
(58) Field of Search ................................ 438/123, 615, 438/108

(56) References Cited

U.S. PATENT DOCUMENTS

| 4,917,286 A | * | 4/1990 | Pollacek | 228/110.1 |
| 5,508,228 A | * | 4/1996 | Nolan et al. | 438/614 |
| 5,686,352 A | * | 11/1997 | Higgins, III | 438/123 |
| 5,885,892 A | * | 3/1999 | Kondo | 438/615 |
| 6,436,734 B1 | * | 8/2002 | Lin | 438/121 |

* cited by examiner

Primary Examiner—W. David Coleman
(74) Attorney, Agent, or Firm—Tung & Associates

(57) ABSTRACT

A method for bonding inner leads of a film substrate such as TAB or COF to bond pads of an IC die without bumps and the structure formed by the method are described. In the method, a base film is first provided which has a plurality of inner leads formed of a trapezoidal cross-section for self-aligning to a plurality of openings in a tapered shape on top of bond pads on the IC die. The inner leads have a larger thickness than the thickness of the opening over the bond pad to afford an intimate contact between the inner leads and the bond pads during a bonding process in a thermal bonder under heat and pressure, or optionally, under heat, pressure and vibration.

12 Claims, 4 Drawing Sheets

METHOD FOR BONDING INNER LEADS TO BOND PADS WITHOUT BUMPS AND STRUCTURES FORMED

FIELD OF THE INVENTION

The present invention generally relates to a method for tape automated bonding inner leads of a tape to bond pads on an IC chip without bumps and structures formed and more particularly, relates to a method for bonding inner leads that are formed in a trapezoidal cross-section to bond pads on an IC die formed in a tapered opening of a dielectric layer in a self-aligned manner and packages formed by the method.

BACKGROUND OF THE INVENTION

Techniques of using an automated tape bonding process in packaging integrated circuit chips have been developed. The technique is used to replace other lead frame wire bonding methods used in packaging integrated circuit chips.

In a tape bonding process, an integrated circuit chip is directly bonded to a foil-type lead frame that is usually less than 0.5 mm in thickness. The technique is also referred to as tape automated bonding or TAB. In a TAB process, a bare copper, a gold or tin plated copper or a copper/plastic laminated tape is first prepared by etching leads into it at positions corresponding to the gold plated bumps over aluminum bonding pads on an integrated circuit chip. The tape is then fed into an inner lead bonder, which is an apparatus equipped with a thermode, i.e. a heated instrument that presses the chip and the tape together. The inner end of the leads are bonded to the bumps on the integrated circuit chip by compressing them under the heated thermode in a single operation. The integrated circuit chip and bonded leads can then be excised out of the tape for connection to a circuit board.

As shown in FIG. 1, a length of copper tape 10 is loaded into an inner lead bonder machine between thermode 12 and anvil 14. An integrated circuit chip 16 is provided and positioned on the flat top 18 of anvil 14 with gold tipped or solder tipped contact bumps 20. Contact bumps 20 face upward. An electric resistance heating coil 22 is used to heat thermode 12 of the inner lead bonder. A suitable copper tape used in this process is a 0.0028 inch thick non-plated copper of 2 oz. weight supplied by the Minnesota Mining and Manufacturing Co. A gold or tin plated copper tape, or a copper/plastic laminated tape may also be used.

In the conventional tape automated bonding technique, contact bumps 20 are made by first building up an aluminum pad to about 1200 nm in height. The aluminum contact bump is then covered with sputtered layers of titanium and an alloy of tungsten. Each layer is about 200~300 nm thick and has a combined thickness of about 500 nm. A thin layer of about 400 nm of gold is then sputtered on top of the contact bump. In a final processing step, a gold layer of 0.001 inch (or 25.4 μm) in thickness is plated on top of the sputtered gold layer.

Thermode 12 is then lowered to contact tape 10 and integrated circuit chip 16. FIG. 2 shows thermode 12 in a closed position wherein etched finger leads 24 in tape 10 are pressed against gold tipped or solder tipped bumps 20 between thermode surface 26 and anvil surface 18. The usual time, temperature, and bonding pressure used are 0.8 sec, 525° C., and 200 gms/bump respectively. However, it is to be understood that bonding pressure can be adjusted based on the heat input from heating coil 22 and the time desired for each particular bonding process.

The present tape automated bonding process requires the additional step of forming solder bumps, or the gold plated solder bumps over aluminum bond pads situated on an IC die. In some other instances, anisotropic conductive film (ACF) may also be required for the bonding process. Either the bumping process or the ACF bonding process is costly and requires an intermediate process step and thus, affects the throughput and yield of the tape to chip bonding process. Moreover, the bumping process further limits the achievement of a fine pitch interconnection structure.

It is therefore an object of the present invention to provide an inner lead bonding method that does not have the drawbacks or the shortcomings of the conventional TAB method.

It is another object of the present invention to provide an inner lead bonding method in which a lead frame can be bonded to an IC die without requiring the formation of bumps on the die.

It is a further object of the present invention to provide a method of bonding a lead frame to an IC die in a self-aligned manner.

It is another further object of the present invention to provide an inner lead bonding method wherein a plurality of inner leads is formed in a trapezoidal cross-section.

It is still another object of the present invention to provide an inner lead bonding method in which bond pads on an IC die are exposed in tapered openings formed in a dielectric material layer on top of the die.

It is yet another object of the present invention to provide an inner lead bonding method in which heat and pressure are used to bond inner leads of a TAB film to bond pads on an IC die.

It is still another further object of the present invention to provide an inner lead bonding method in which heat, pressure and vibration are used to bond inner leads of a TAB film to bond pads on an IC die.

SUMMARY OF THE INVENTION

In accordance with the present invention, a method for bonding inner leads of a TAB or COF film to bond pads of an IC die without bumps and structures formed by the method are disclosed.

In a preferred embodiment, a method for bonding inner leads of a film substrate to bond pads of an IC die without bumps can be carried out by the operating steps of providing a base film that has a first plurality of inner leads formed of a first electrically conductive metal thereon extending inwardly toward a center of the base film, the first plurality of inner leads is formed in a trapezoidal cross-section that has a first height, a top width and a bottom width, the top width is smaller than the bottom width; providing an IC die that has a second plurality of bond pads formed of a second electrically conductive metal along and extending to an outer periphery of the IC chip; coating a top surface of the IC chip with an insulating material layer that has a second plurality of openings formed therein exposing the second plurality of bond pads, each of the second plurality of openings has a second height, a top width and a bottom width, the top width is larger than the bottom width, the bottom width of the second plurality of openings is larger than the top width of the first plurality of inner leads, the second height of the second plurality of openings is smaller than the first height of the first plurality of inner leads; positioning the base film and the IC chip in a face-to-face relationship such that each of the first plurality of inner leads is received by a corresponding one of the second plurality of openings; and pressing and heating the base film and the IC chip together until each of the first plurality of inner leads is bonded to a corresponding one of the second plurality of bond pads.

The method for bonding inner leads of a film substrate to bond pads of an IC die without bumps may further include the step of forming the base film of a dielectric material selected from the group consisting of polyimide, polyester, benzo-cyclo-butene, PMMA and epoxy. The method may further include the step of forming the first plurality of inner leads of Cu, or the step of forming the first plurality of inner leads to a first height of at least 15 $\mu$m, or the step of forming the second plurality of openings to a second height of less than 15 $\mu$m. The method may further include the step of forming the second plurality of bond pads of a material selected from the group consisting of Al, Cu, Au, Ag, Co, Ti and alloys thereof. The method may further include the step of filling a gap formed in-between the first plurality of inner leads and the second plurality of openings with an underfill material, or the step of forming the insulating material layer with polyimide or benzo-cyclo-butene. The method may further include the step of forming a dielectric film on top of the first plurality of inner leads, or the step of selecting the dielectric film from the group consisting of a polyimide film, a PMMA film and an epoxy film. The method may further include the step of coating the first plurality of inner leads with an adhesion layer of Sn or Ni/Au, or the step of coating the second plurality of bond pads with an anti-oxidation layer selected from the group consisting of Au, Ag and Sn.

The present invention is further directed to an IC chip package which includes a base film that has a first plurality of inner leads formed of a first electrically conductive metal extending inwardly toward a center of the base film, the first plurality of inner leads is formed in a trapezoidal cross-section that has a first height, a top width and a bottom width, the top width is smaller than the bottom width; and an IC chip that has a second plurality of bond pads formed of a second electrically conductive metal along and extended to an outer periphery of the IC chip, wherein a top surface of the IC chip is covered with an insulating material layer that has a second plurality of openings formed therein exposing the second plurality of bond pads, each of the second plurality of openings has a second height, a top width and a bottom width, the top width is larger than the bottom width, the bottom width of the second plurality of openings is larger than the top width of the first plurality of inner leads, the second height of the second plurality of openings is smaller than the first height of the first plurality of inner leads; whereby the base film and the IC chip are bonded in a face-to-face relationship such that each of the first plurality of inner leads is received by a corresponding one of the second plurality of openings, and each of the first plurality of inner leads is bonding to a corresponding one of the second plurality of bond pads.

In the IC chip package, the base film may be a flexible film with no openings therein for forming a chip-on-flex (COF) package, or the base film may be a tape-automated-bonded (TAB) film with an opening therein for forming a TAB package. The first plurality of inner leads may further be covered by a dielectric film. The base film may be formed of a material selected from the group consisting of polyimide, polyester, benzo-cyclo-butene, PMMA and epoxy. The inner leads may be formed of Cu, or may be formed to a height of at least 15 $\mu$m. The second plurality of openings may be formed to a height of less than 15 $\mu$m. The second plurality of bond pads may be formed of a material selected from the group consisting of Al, Cu, Au, Ag, Co, Ti and alloys thereof. The IC chip package may further include an underfill material filling a gap formed between the first plurality of inner leads and the second plurality of openings. The insulating material layer may be formed of polyimide or benzo-cyclo-butene. The first plurality of inner leads may further be coated with an adhesion layer of Sn or Ni/Au. The second plurality of bond pads may be covered with an oxidation layer of Au, Ag or Sn.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a method for bonding inner leads of a TAB film or a COF film to bond pads on an IC die without using bumps and packages formed by the method.

In the present invention novel method, a base film of either the TAB type or the COF type is first provided which has a first plurality of inner leads formed of a conductive metal extending inwardly toward a center of the base film. The plurality of inner leads may be formed in a trapezoidal cross-section that has a first height, a top width and a bottom width wherein the top width is smaller than the bottom width. An IC die or chip is then provided which has a second plurality of bond pads formed of a conductive metal along an outer periphery of the die. The bond pads are formed extending to the outer periphery of the die. A top surface of the IC die is coated with an insulating material layer with a second plurality of openings formed therein to expose the bond pads. Each of the second plurality of openings is formed in a tapered shape that has a second height, a top width and a bottom width. The top width of the opening is larger than the bottom width of the opening. To provide a self-aligning function for the present invention method, the bottom width of the second plurality of openings is larger than the top width of the first plurality of inner leads. To provide an effective bonding method for the present invention, the second height of the second plurality of openings is smaller than the first height of the first plurality of inner leads such that an intimate contact can be formed while bonding the inner leads to the bond pad under heat and pressure and optionally, under vibration.

During the bonding operation, the base film of TAB or COF and the IC die are placed in a face-to-face relationship such that each of the first plurality of inner leads is received in a self-aligned manner by a corresponding one of the second plurality of openings in the dielectric layer over the bond pads. When heat and pressure are applied to the base film and the IC die, each of the first plurality of inner leads is effectively bonded to a corresponding one of the second plurality of bond pads without requiring solder bumps or metal bumps.

The present invention further discloses a TAB film or COF film and an IC die package that is formed by the method described previously. The TAB film is supplied with an open window in the center of the film exposing the conductive leads or the inner leads. The COF film is supplied without an open window and thus, the conductive inner leads are supported by a base film. On top of either the TAB film or the COF film, i.e. thus partially covering the conductive inner leads, is a second dielectric material layer to further protect the inner leads.

Figure 1:
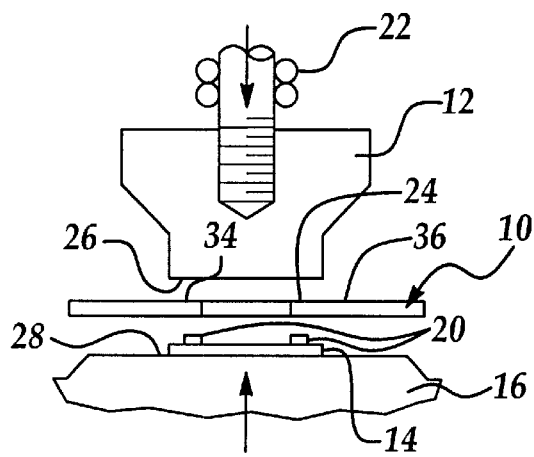
FIG. 1 is a cross-sectional view of a conventional TAB film and an IC die positioned in a thermal bonder.
Figure 2:
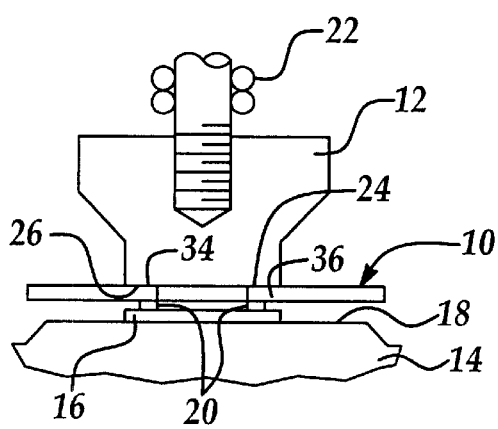
FIG. 2 is a cross-sectional view of the conventional TAB film and the IC die bonded together under heat and pressure of the thermal bonder.
Figure 3:
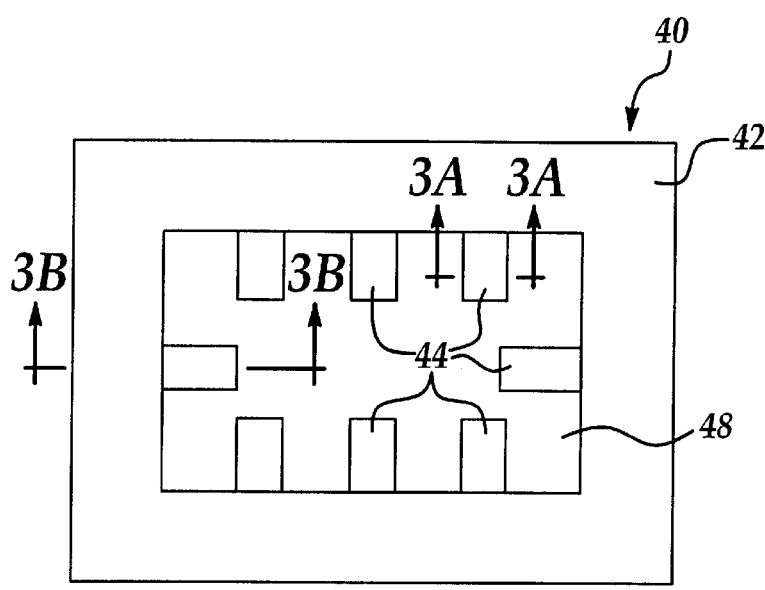
FIG. 3 is a plane view of the present invention TAB film illustrating the plurality of inner leads.
Figure 3A:
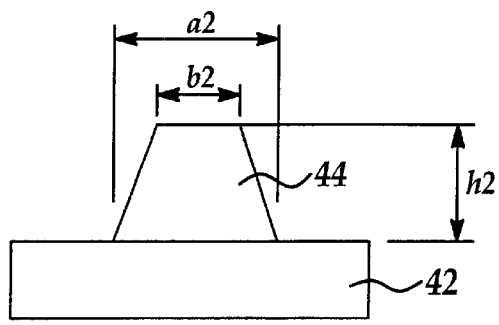
FIG. 3A is an enlarged, cross-sectional view of an inner lead in a trapezoidal shape on the base film.

Referring initially to FIG. 3, wherein a plane view of a present invention substrate 40 is shown. The substrate 40 may be suitably formed of an insulating material layer 42, or a base film layer, or a first dielectric layer. A plurality of inner leads 44 are formed of a conductive metal such as Cu on top of the base insulating film 42. This is further shown in FIGS. 3A, 3B and 3C in sectional views taken along section 3—3 and section 4—4 in FIG. 3. As shown in FIG. 3A, the inner leads 44 are formed by etching photolithographically into a trapezoidal shape such that a top width b2 is smaller than a bottom width a2. The height of the trapezoidal-shaped inner lead 44 is h2.

Figure 3B:
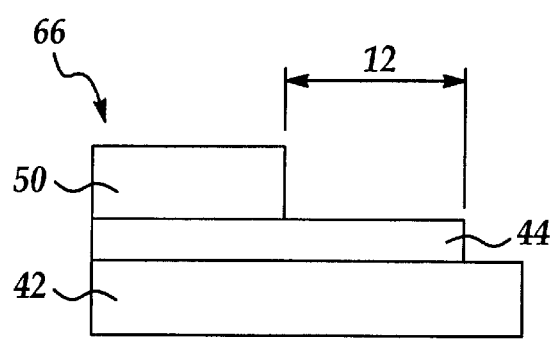
FIG. 3B is an enlarged, cross-sectional view taken along section 4—4 of FIG. 3 for a chip-on-flex construction.
Figure 3C:
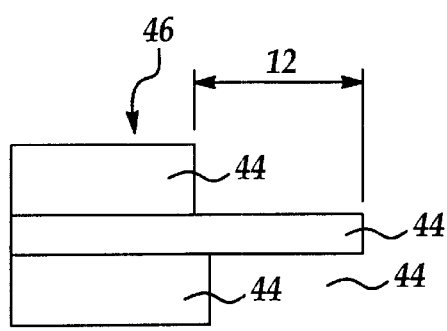
FIG. 3C is an enlarged, cross-sectional view of an inner lead taken along section 4—4 of FIG. 3 illustrating a TAB construction.

The present invention based film substrate 40 can be formed either of a TAB type, shown in FIG. 3C, or formed in a COF (chip on flex) film, shown in FIG. 3B. In the TAB film structure 46, an open window 48 is provided in the film with the inner leads 44 formed of copper extended therein. On top of the conductive inner leads 44, a second dielectric layer 50, of an insulating material, may be coated to afford further protection of the inner leads 44. The first dielectric layer 42 and the second dielectric layer 50 may be formed of a suitable insulating material such as polyimide, polyester, benzo-cyclo-butene, PMMA or epoxy.

FIG. 3B illustrates another embodiment of the base film substrate 40 of the COF type in which the first dielectric layer 42 extends all the way under the inner leads 44 such that no open window is provided. These alternate embodiments are further shown in the cross-sectional views of FIGS. 7A–8B illustrating the fabrication process of the present invention.

The height h2 of the inner lead 44 may be suitably more than 15 μm, for instance, at 20 μm. It is designed such that the first height h2 is larger than the second height h1 for the opening exposing the bond pad, shown in FIG. 4A. On top of the inner leads, or lead fingers 44, may be coated with an adhesion layer of metal such as Sn or Ni/Au layers.

Figure 4:
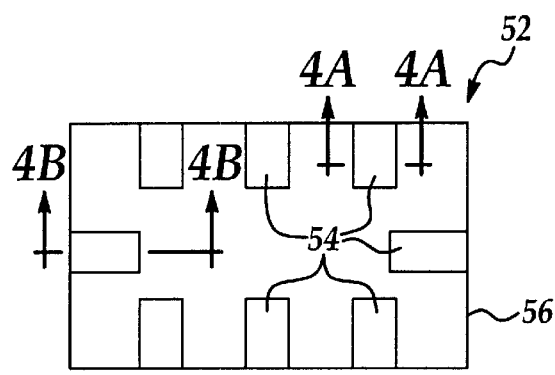
FIG. 4 is a plane view of a present invention IC die equipped with bond pads extended to an outer periphery of the die.

FIG. 4 is a plane view of a present invention IC die 52 having a plurality of bond pads 54 formed on top. Note that each of the plurality of bond pads 54 is formed along an outer periphery 56 of the IC die 52, and furthermore, extends all the way to the outer periphery 56. The bond pads 54 may be suitably formed of a conductive metal such as Al, Cu, Au, Ag, Co, Ti and alloys thereof. On top of the IC die 52, is coated with a protective layer 58 of an insulating material.

Figure 4A:
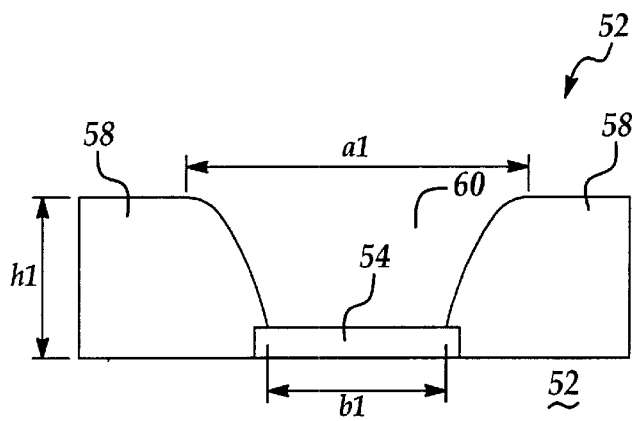
FIG. 4A is an enlarged, cross-sectional view taken along section 1—1 of FIG. 4 illustrating a tapered opening for a bond pad.
Figure 4B:
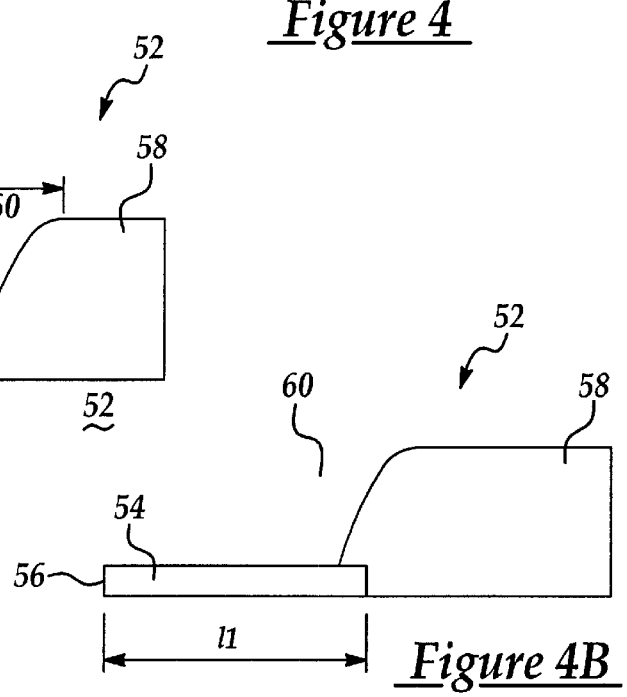
FIG. 4B is an enlarged, cross-sectional view taken along section 2—2 of FIG. 4 illustrating a bond pad extended to an outer periphery of an IC die.

Cross-sectional views of the tapered openings 60 of the protective layer 58 and the bond pads 54 are further shown in FIGS. 4A and 4B taken along sections 1—1 and 2—2, respectively. It should be noted that a tapered opening 60 is formed deliberately to achieve a further benefit of the present invention method of self-aligning during the alignment process of the IC die 52 with the base substrate 40. This will be more clearly shown in FIGS. 6A and 6B in a later section.

The height of the opening 60, i.e. or approximately the thickness of the protective layer 58 which is formed of polyimide or benzo-cyclo-butene, is h1, as shown in FIG. 4A. As previously discussed, the height h1 should be less than 15 μm, such that when the inner leads having a thickness of more than 15 μm is positioned in the opening 60. An intimate contact between the bond pad 54 and the inner lead 44 can be achieved to afford the formation of a perfect bond. It should be noted that the length of the bond pad 11 should be larger than the length of the inner leads 44, i.e. the exposed portion of the inner leads, of 12 to allow a mismatch in alignment. It also desirable that a1<a2 and b1<b2 to allow a small mismatch during the self-alignment process.

Figure 5:
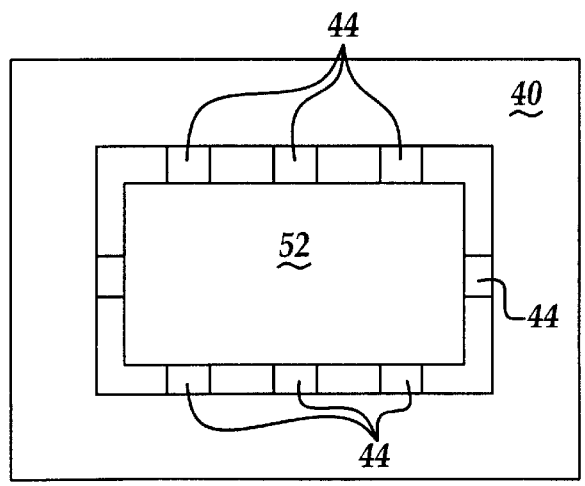
FIG. 5 is a plane view of the present invention TAB film bonded to the IC die.
Figure 6A:
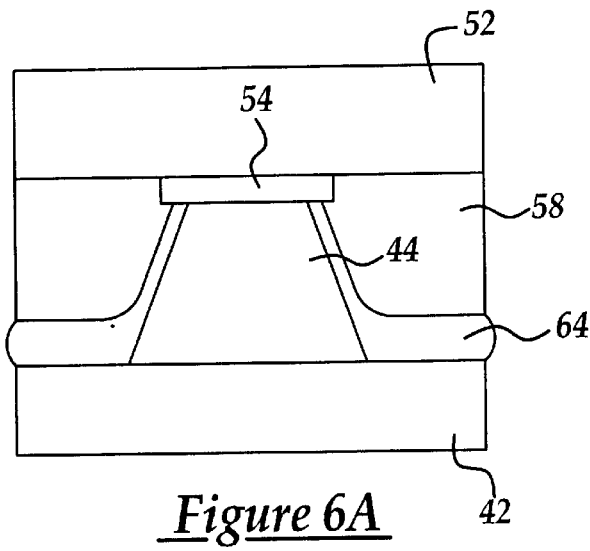
FIG. 6A is an enlarged, cross-sectional view illustrating the self-aligning of a present invention inner lead bonded to a bond pad.
Figure 6B:
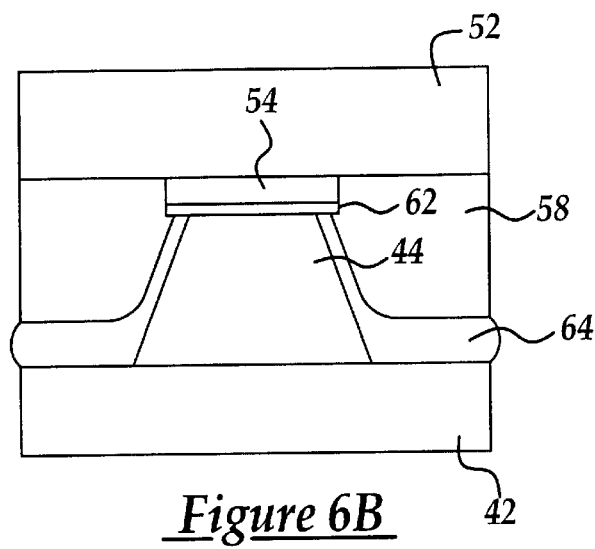
FIG. 6B is an enlarged, cross-sectional view of the present invention inner lead bonded to a bond pad with a UBM layer on top of the pad.

FIGS. 5, 6A and 6B are a plane view and cross-sectional views of the present invention package after the bonding process. FIG. 5 is a plane view showing the IC die 52 being bonded to the film substrate 40 after the bonding process. Similarly, FIGS. 6A and 6B are cross-sectional views showing the present invention structure after the bonding process. It is to be noted that in the embodiment of FIG. 6B, an additional UBM layer 62 is utilized to further improve bonding between the inner lead 44 and the bond pad 54.

Also shown in FIGS. 6A and 6B, and optional with the present invention method, is an underfill layer 64 filling a gap in-between the inner leads 44, the bond pad 54 and the insulating material layer 58 on the IC die 52. The underfill layer 54 can also be a non-conductive adhesive layer or an NCA layer.

Figure 7A:
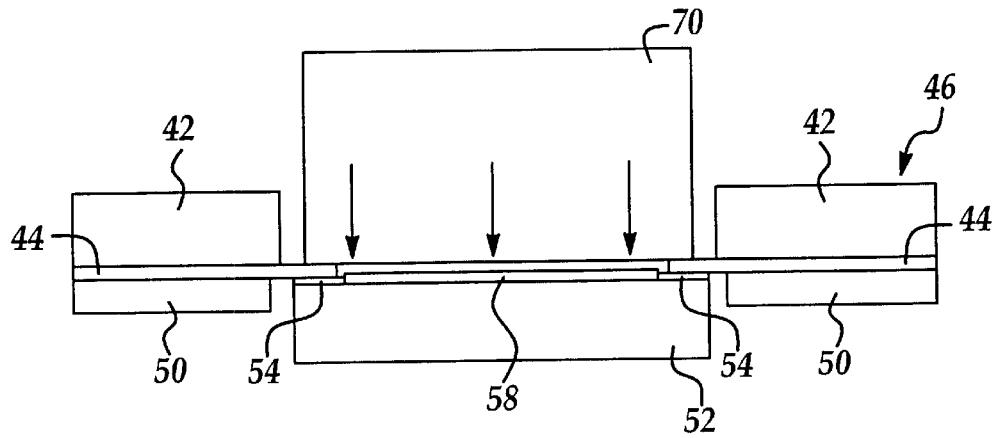
FIG. 7A is a cross-sectional view illustrating the present invention method of bonding a TAB film to an IC die under heat and pressure.
Figure 7B:
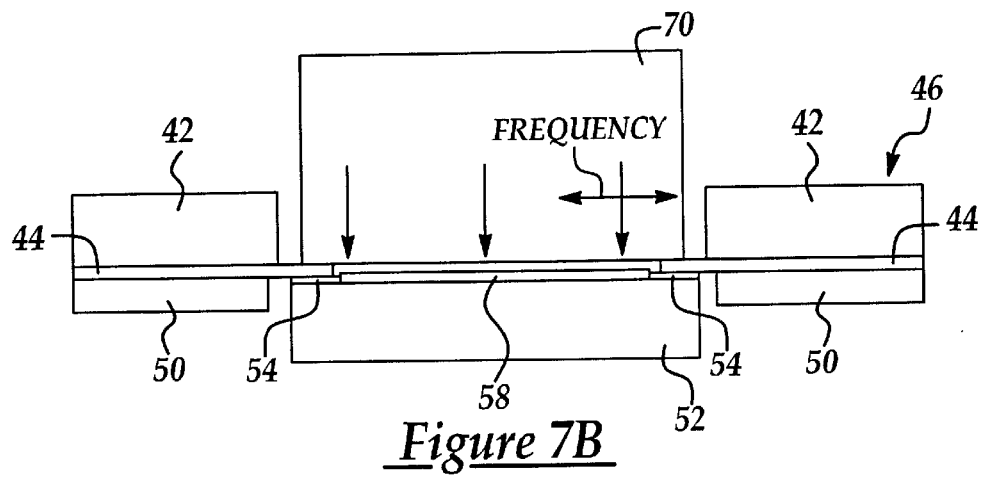
FIG. 7B is a cross-sectional view illustrating the present invention method of bonding a TAB film to an IC die under heat, pressure and vibration.
Figure 8A:
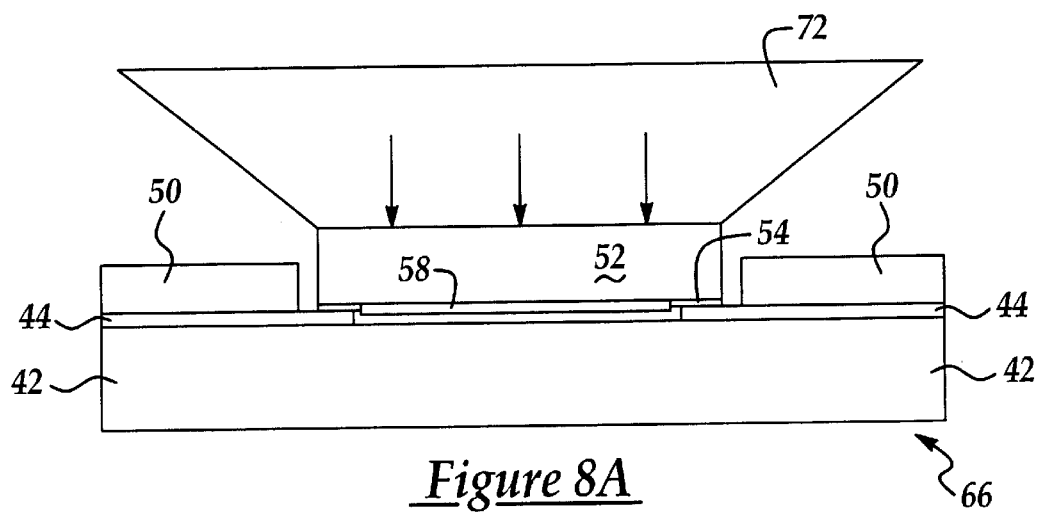
FIG. 8A is a cross-sectional view illustrating a present invention method for bonding a COF film to an IC die under heat and pressure.
Figure 8B:
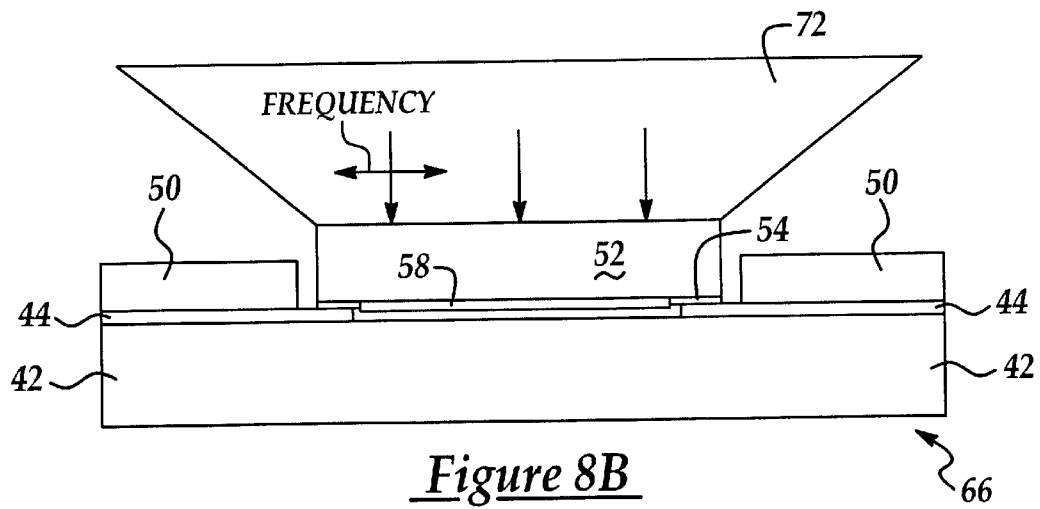
FIG. 8B is a cross-sectional view illustrating the present invention method of bonding a COF film to an IC die under heat, pressure and vibration.

The present invention novel method for bonding inner leads of a substrate film to bond pads of an IC die is also shown in FIGS. 7A and 7B for a TAB film, and in FIGS. 8A and 8B for a COF film.

As shown in FIG. 7A, an IC die 52 and a TAB film substrate 42 are placed in a thermal bonder or between a thermode 70 and an anvil (not shown) under heat and pressure. The inner leads 44 on the TAB film 42 are then bonded to bond pads 54 situated on the top surface of the IC die 52. A solder resist film 50 may be used as the second dielectric film shown in FIG. 3C. It should be noted, as shown in FIGS. 7A and 7B, the total height of the protective layer 58 on the IC die 52 must be smaller than the combined thickness of the inner lead 44 and the bond pad 54 to produce an intimate bond between the inner lead and the bond pad.

The embodiment shown in FIG. 7B further utilizes a vibration in the horizontal direction, in addition to the heat and pressure applied by the thermode 70, which further improves the bonding between the inner leads 44 and the bond pads 54. The vibration can be produced by any mechanical means, and preferably, should be produced in the ultra-sonic range of vibration.

The present invention novel bonding method for an IC die to a COF film is shown in FIGS. 8A and 8B. In this embodiment, the IC chip 54 is placed on top since the COF film 66 does not have a window opened therein. A different thermode 72 is utilized in forming the bond under heat and pressure shown in FIG. 8A, or under heat, pressure and vibration shown in FIG. 8B. The vibration motion further improves the bond formed between the bond pad 54 and the inner lead 44.

The present invention novel method for bonding inner leads of a film substrate of TAB or COF to bond pads of an IC die and the package formed thereof have therefore been amply described in the above description and in the appended drawings of FIGS. 3–8B.

While the present invention has been described in an illustrative manner, it should be understood that the terminology used is intended to be in a nature of words of description rather than of limitation.

Furthermore, while the present invention has been described in terms of a preferred and three alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A method for bonding inner leads of a film substrate to bond pads of an IC chip without bumps comprising the steps of:

providing a base film having a first plurality of inner leads formed of a first electrically conductive metal thereon extending inwardly toward a center of said base film, said first plurality of inner leads being formed in a trapezoidal cross-section having a first height, a top width and a bottom width, said top width smaller than said bottom width;

providing an IC chip having a second plurality of bond pads formed of a second electrically conductive metal along and extended to an outer periphery of said IC chip;

coating a top surface of said IC chip with an insulating material layer and forming a second plurality of openings therein exposing said second plurality of bond pads, each of said second plurality of openings having a second height, a top width and a bottom width, said top width being larger than said bottom width, said bottom width of the second plurality of openings being larger than said top width of said first plurality of inner leads, said second height of the second plurality of openings being smaller than said first height of said first plurality of inner leads;

positioning said base film and said IC chip in a face-to-face relationship such that each of said first plurality of inner leads is received by a corresponding one of said second plurality of openings; and pressing and heating said base film and said IC chip together with each of said first plurality of inner leads and bonding to a corresponding one of said second plurality of bond pads.

2. A method for bonding inner leads of a film substrate to bond pads of an IC chip without bumps according to claim 1 further comprising the step of forming said base film of a dielectric material selected from the group consisting of polyimide, polyester, benzo-cyclo-butene, PMMA and epoxy.

3. A method for bonding inner leads of a film substrate to bond pads of an IC chip without bumps according to claim 1 further comprising the step of forming said first plurality of inner leads of Cu.

4. A method for bonding inner leads of a film substrate to bond pads of an IC chip without bumps according to claim 1 further comprising the step of forming said first plurality of inner leads to a first height of at least 15 $\mu$m.

5. A method for bonding inner leads of a film substrate to bond pads of an IC chip without bumps according to claim 1 further comprising the step of forming said second plurality of openings to a second height of less than 15 $\mu$m.

6. A method for bonding inner leads of a film substrate to bond pads of an IC chip without bumps according to claim 1 further comprising the step of forming said second plurality of bond pads of a material selected from the group consisting of Al, Cu, Au, Ag, Co, Ti and alloys thereof.

7. A method for bonding inner leads of a film substrate to bond pads of an IC chip without bumps according to claim 1 further comprising the step of filling a gap formed in-between said first plurality of inner leads and said second plurality of openings with an underfill material.

8. A method for bonding inner leads of a film substrate to bond pads of an IC chip without bumps according to claim 1 further comprising the step of forming said insulating material layer with polyimide or benzo-cyclo-butene.

9. A method for bonding inner leads of a film substrate to bond pads of an IC chip without bumps according to claim 1 further comprising the step of forming a dielectric film on top of said first plurality of inner leads.

10. A method for bonding inner leads of a film substrate to bond pads of an IC chip without bumps according to claim 1 further comprising the step of selecting said dielectric film from the group consisting of a polyimide film, a PMMA film and an epoxy film.

11. A method for bonding inner leads of a film substrate to bond pads of an IC chip without bumps according to claim 1 further comprising the step of coating said first plurality of inner leads with an adhesion layer of Sn or Ni/Au.

12. A method for bonding inner leads of a film substrate to bond pads of an IC chip without bumps according to claim 1 further comprising the step of coating said second plurality of bond pads with an anti-oxidation layer selected from the group consisting of Au, Ag and Sn.

* * * * *